United States Patent
Na et al.

(10) Patent No.: US 8,486,195 B2
(45) Date of Patent: Jul. 16, 2013

(54) ATOMIC LAYER DEPOSITION APPARATUS AND METHOD OF FABRICATING ATOMIC LAYER USING THE SAME

(75) Inventors: Heung-Yeol Na, Yongin (KR); Ki-Yong Lee, Yongin (KR); Min-Jae Jeong, Yongin (KR); Jong-Won Hong, Yongin (KR); Yun-Mo Chung, Yongin (KR); Eu-Gene Kang, Yongin (KR); Seok-Rak Chang, Yongin (KR); Jin-Wook Seo, Yongin (KR); Ji-Su Ahn, Yongin (KR); Tae-Hoon Yang, Yongin (KR); Young-Dae Kim, Yongin (KR); Byoung-Keon Park, Yongin (KR); Dong-Hyun Lee, Yongin (KR); Kil-Won Lee, Yongin (KR); Jae-Wan Jung, Yongin (KR); Jong-Ryuk Park, Yongin (KR); Bo-Kyung Choi, Yongin (KR); Sang-Hyun Yun, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 672 days.

(21) Appl. No.: 12/714,217

(22) Filed: Feb. 26, 2010
(Under 37 CFR 1.47)

(65) Prior Publication Data
US 2010/0227060 A1 Sep. 9, 2010

(30) Foreign Application Priority Data

Mar. 4, 2009 (KR) .................. 10-2009-0018490

(51) Int. Cl.
C23C 16/00 (2006.01)
C23F 1/00 (2006.01)
H01L 21/306 (2006.01)

(52) U.S. Cl.
USPC ............ 118/720; 156/345.3; 156/345.19

(58) Field of Classification Search
USPC ............... 118/720; 156/345.3, 345.19
See application file for complete search history.

(56) References Cited

U.S. PATENT DOCUMENTS

| 3,241,519 | A | * | 3/1966 | Lloyd | 118/720 |
| 5,879,459 | A | * | 3/1999 | Gadgil et al. | 118/715 |
| 2005/0250228 | A1 | * | 11/2005 | Ko | 438/21 |

FOREIGN PATENT DOCUMENTS

| JP | 2002-008859 | 1/2002 |
| KR | 10-2006-0006349 | 1/2006 |

(Continued)

OTHER PUBLICATIONS

English translation, KR 2007-0059249, Shin, Jun. 2007.*

(Continued)

*Primary Examiner* — Keath Chen
(74) *Attorney, Agent, or Firm* — H.C. Park & Associates, PLC

(57) ABSTRACT

An atomic layer deposition apparatus includes a chamber, a vacuum pump to control a pressure in the chamber, a gas supply unit to supply a reaction gas into the chamber, a substrate holder disposed between the vacuum pump and the gas supply unit and having a heater, a mask assembly disposed between the substrate holder and the gas supply unit and having a cooling path to move coolant, and a coolant source to supply the coolant into the cooling path. The mask assembly is positioned a first distance from a substrate, and coolant is supplied into the cooling path of the mask assembly. The substrate is heated using the heater of the substrate holder, a pressure of the chamber is controlled using the vacuum pump, and reaction gasses are sequentially supplied through the gas supply unit.

13 Claims, 4 Drawing Sheets

FOREIGN PATENT DOCUMENTS

| | | |
|---|---|---|
| KR | 10-0579406 | 5/2006 |
| KR | 10-2006-0084048 | 7/2006 |
| KR | 10-2007-0059249 | 6/2007 |
| KR | 10-2007-0088184 | 8/2007 |
| KR | 10-2008-0023418 | 3/2008 |
| KR | 10-2008-0082539 | 9/2008 |

OTHER PUBLICATIONS

English Abstract for Korean Patent Publication No. 10-2006-0018745.

* cited by examiner

ATOMIC LAYER DEPOSITION APPARATUS AND METHOD OF FABRICATING ATOMIC LAYER USING THE SAME

CROSS-REFERENCE TO RELATED APPLICATION

This application claims the benefit of Korean Patent Application No. 10-2009-0018490, filed Mar. 4, 2009 in the Korean Intellectual Property Office, the disclosure of which is incorporated herein by reference in its entirety.

BACKGROUND OF THE INVENTION

1. Field of the Invention

Aspects of the present invention relate to an atomic layer deposition apparatus and a method of fabricating an atomic layer using the same. More particularly, aspects of the present invention relate to an atomic layer deposition apparatus and a method of fabricating an atomic layer using the same by which deformation of a substrate due to an inner temperature of a chamber during an atomic layer deposition process is prevented such that the atomic layer is uniformly formed on the substrate.

2. Description of the Related Art

Flat panel display devices are used as display devices and replace cathode ray tube display devices due to their light-weight and compact characteristics. Typical examples of such flat panel display devices are a liquid crystal display device (LCD) and an organic light emitting diode (OLED) display device. Among these, the OLED display device has advantages of better brightness and viewing angle characteristics than the LCD and a super-slim structure due to the absence of a backlight unit.

OLED display devices may be classified into a passive matrix OLED display device and an active matrix OLED display device depending on the driving method. The active matrix OLED display device has a circuit in which a thin film transistor (TFT) is used. The passive matrix OLED display device can be readily fabricated because its display region is formed as a matrix device constituted by positive and negative electrodes. However, the passive matrix OLED display device is limited to applications of low resolution and small-sized display devices due to its resolution, increase in drive voltage, decrease in lifespan of material, etc. The active matrix OLED display device has a display region in which a thin film transistor is formed on each pixel, so that uniform current can be supplied to each pixel to provide stable brightness. In addition, the active matrix OLED display device consumes less power and is suitable for providing high-resolution and large-sized display devices.

The TFT generally includes a semiconductor layer having a source region, a drain region and a channel region, a gate electrode, and source and drain electrodes. While the semiconductor layer may be formed of polycrystalline silicon (poly-Si) or amorphous silicon (a-Si), since electron mobility of the poly-Si is higher than that of the a-Si, the poly-Si is being widely used.

Methods of crystallizing the a-Si into the poly-Si may include solid phase crystallization (SPC), laser crystallization, super grain silicon (SGS) crystallization, metal induced crystallization (MIC), and metal induced lateral crystallization (MILC). The solid phase crystallization method has disadvantages in that a process time is too long and annealing at a high temperature for a long time readily causes deformation of a substrate. The laser crystallization method has disadvantages in that an expensive laser apparatus is needed and protrusions may be generated from the surface of the crystallized poly-Si to deteriorate the interface characteristics between a semiconductor layer and a gate insulating layer.

In order to overcome the disadvantages of the SPC and the laser crystallization methods, crystallization methods using metal, such as MIC, MILC, or SGS crystallization methods, which are capable of performing crystallization at a lower temperature for a shorter time than the SPC method, are used. The crystallization method using metal may include a sputtering process of applying plasma to a metal target to deposit a metal catalyst on a substrate, or an atomic layer deposition (ALD) process of forming an atomic layer of a metal catalyst on a substrate through a chemical method using a reaction gas including the metal catalyst.

However, the sputtering process has a problem in that a metal catalyst cannot be readily deposited on a substrate at an ultimately low concentration. The ALD process has a problem in that it is difficult to uniformly form an atomic layer on a substrate. In the ALD process, when a mask assembly having a plurality of holes is used to improve the uniformity of the atomic layer, the mask assembly may become deformed due to heat in a chamber required for a chemical reaction of a reaction gas during the ALD, or the reaction gas may cause a chemical reaction at the surface of the mask assembly or in the holes of the mask assembly to decrease the efficiency thereof.

SUMMARY OF THE INVENTION

Aspects of the present invention provide an atomic layer deposition apparatus and a method of fabricating an atomic layer using the same that are capable of preventing deformation of a mask assembly due to heat in a chamber and preventing chemical reaction of a reaction gas at the surface of the mask assembly or in a hole of the mask assembly.

According to an embodiment of the present invention, an atomic layer deposition apparatus includes: a chamber; a vacuum pump configured to control a pressure in the chamber; a gas supply unit disposed opposite to the vacuum pump to supply a reaction gas into the chamber; a substrate holder disposed between the vacuum pump and the gas supply unit and having a heater installed therein; a mask assembly disposed between the substrate holder and the gas supply unit and having a cooling path formed in an edge thereof to move coolant; and a coolant source configured to supply the coolant into the cooling path of the mask assembly.

According to another embodiment of the present invention, an atomic layer deposition apparatus includes a deposition chamber; a gas supply unit that supplies a reaction gas into the deposition chamber; a heated substrate holder that holds a substrate in a position in the deposition chamber such that the reaction gas is deposited on the substrate; and a mask assembly disposed between the substrate holder and the gas supply unit to diffuse the reaction gas before the reaction gas is deposited on the substrate, the mask assembly having a central portion corresponding in area and position with the substrate and a peripheral portion including a cooling path in which a coolant is supplied to the mask assembly According to another embodiment of the present invention, a method of fabricating an atomic layer includes: seating a substrate on a substrate holder having a heater installed therein; positioning a mask assembly having a cooling path formed therein to be spaced apart a first distance from the substrate; supplying coolant into the cooling path of the mask assembly; heating the substrate using the heater of the substrate holder; controlling a pressure in a chamber using a vacuum pump at a certain level; and sequentially supplying a first reaction gas and a second reaction gas through the gas supply unit.

According to another embodiment of the present invention, a method of fabricating an atomic layer on a substrate includes heating the substrate; supplying one or more reaction gases to the substrate, wherein the one or more reaction gases are deposited on the substrate after passing through a mask assembly spaced apart from the substrate; and cooling the mask assembly by supplying a coolant to a cooling path in the mask assembly.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
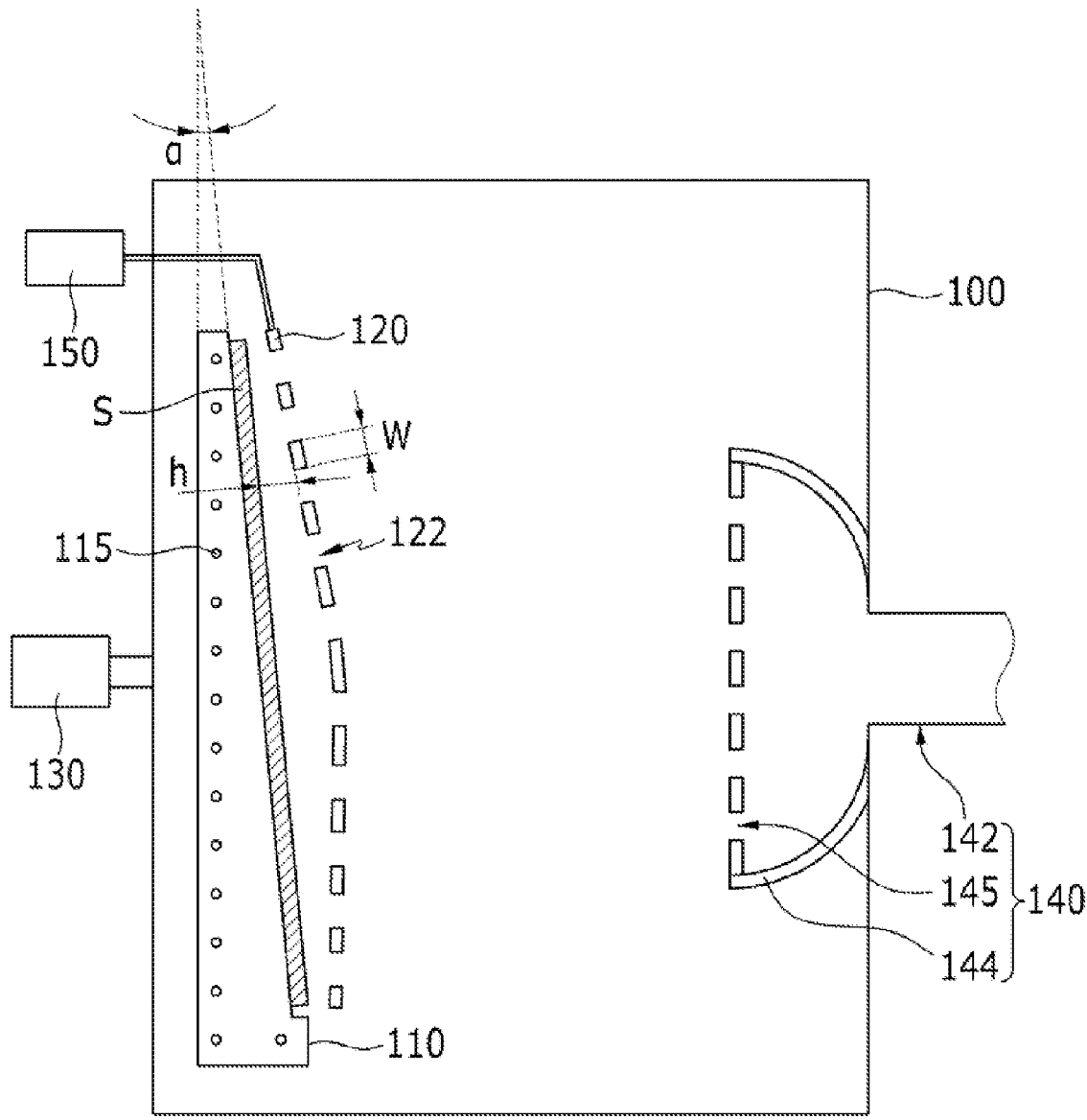
FIG. 1 is a schematic view of an atomic layer deposition apparatus in accordance with an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2A:
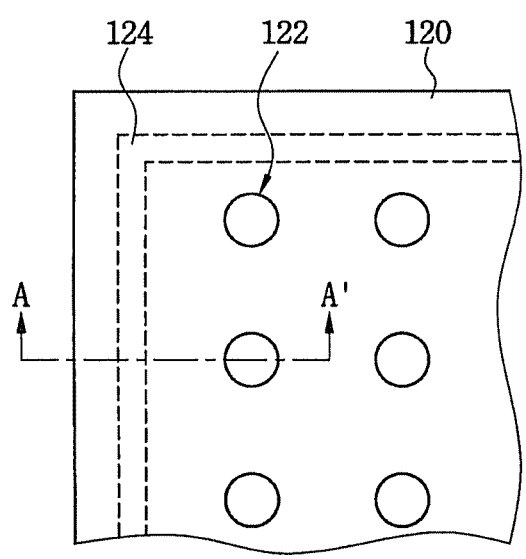
FIG. 2A is a plan view of a mask frame of the atomic layer deposition apparatus in accordance with an exemplary embodiment of the present invention.
Figure 2B:
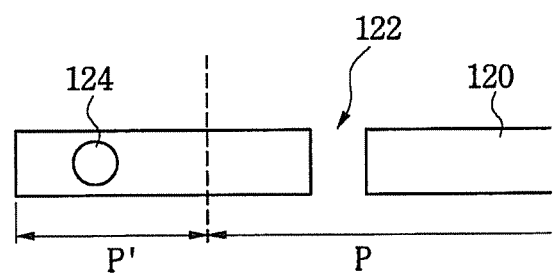
FIG. 2B is a cross-sectional view taken along line A-A' of FIG. 2A.

FIG. 1 is a schematic view of an atomic layer deposition apparatus in accordance with an exemplary embodiment of the present invention, FIG. 2A is a plan view of a mask frame of the atomic layer deposition apparatus in accordance with an exemplary embodiment of the present invention, and FIG. 2B is a cross-sectional view taken along line A-A' of FIG. 2A.

Referring to FIGS. 1, 2A and 2B, the atomic layer deposition apparatus includes a chamber 100, a vacuum pump 130 configured to control a pressure in the chamber 100, a gas supply unit 140 disposed opposite to the vacuum pump 130 to supply a reaction gas into the chamber 100, a substrate holder 110 disposed between the vacuum pump 130 and the gas supply unit 140 and having a heater 115 installed therein, a mask assembly 120 disposed between the substrate holder 110 and the gas supply unit 140 and having a cooling path 124 formed in an edge thereof to move coolant; and a coolant source 150 configured to supply the coolant into the cooling path 124 of the mask assembly 120.

An ALD process is performed by sequentially supplying a first reaction gas including a deposition material to be deposited on a substrate S and a second reaction gas which chemically reacts with the first reaction gas to form an atomic layer of the deposition material on the substrate S into the chamber 100. The ALD process is performed in a state in which the interior of the chamber 100 having the substrate S seated therein is heated to a certain temperature, so that the first reaction gas chemically reacts with the second reaction gas on the substrate S to form the atomic layer of the deposition material on the substrate S.

In order to prevent the formation of impurities due to a chemical reaction of the first and second reaction gases in the chamber 100 at locations other than on the surface of the substrate S, an inert gas in the chamber 100 may be substantially removed before the first and second reaction gases are supplied. Therefore, while not required in all aspects, the atomic layer deposition apparatus may further include an exhaust pump (not shown) for removing a reaction gas remaining in the chamber 100, i.e., an inert gas, before the reaction gas is supplied into the chamber 100 by the gas supply unit 140.

The substrate holder 110 functions to seat the substrate S, on which an atomic layer is to be deposited. The substrate holder 110 has a heater 115 that heats the substrate S to promote a chemical reaction of the reaction gas. In order to prevent unnecessary reaction gases or impurities generated due to chemical reaction of the reaction gas in the chamber 100 and not on the surface of the substrate S from being deposited on the surface of the substrate S, the vacuum pump 130 and the gas supply unit 140 may be disposed at a side surface of the chamber 100, and the substrate holder 110 may be disposed in parallel at the side surface of the chamber 100, so that the substrate S seated on the substrate holder 110 is disposed perpendicular to a bottom surface of the chamber 100.

In addition, when the substrate holder 110 is disposed parallel to the side surface of the chamber 100, in order to prevent deformation of the substrate S or separation of the substrate S from the substrate holder 110, the substrate holder 110 may further include a fixing unit (not shown) for fixing the substrate S. Alternatively, as shown, the substrate holder 110 may be configured such that a surface of the substrate holder 110 facing the gas supply unit 140 is inclined to a certain angle with respect to a surface thereof facing the vacuum pump 130, thereby preventing deformation or separation of the substrate S without requiring a separate fixing unit. It is to be understood that a fixing unit can be used when the holder 110 is inclined in aspects of the invention.

When the surface of the substrate holder 110 facing the gas supply unit 140 is inclined by more than 20° with respect to the surface thereof facing the vacuum pump 130, it is difficult to uniformly deposit the reaction gas on the substrate S due to an incident angle of the reaction gas injected by the gas supply unit 140 with respect to the surface of the substrate S. Therefore, the angle between the surface of the substrate holder 110 facing the gas supply unit 140 and the surface thereof facing the vacuum pump 130 may be 1° to 20°.

The mask assembly 120 functions to limit a moving path of the reaction gas supplied by the gas supply unit 140. The mask assembly 120 includes a plurality of holes 122 through which the reaction gas supplied into the chamber 100 by the gas supply unit 140 passes and has the cooling path 124 through which coolant moves. The cooling path 124 functions to discharge heat applied to the mask assembly 120. When the mask assembly 120 is disposed adjacent to the substrate S, in order to avoid interfering with the chemical reaction of the reaction gas deposited on the substrate S, the cooling path 124 may be disposed in the mask assembly 120 at portions of the mask assembly 120 that do not overlap the substrate S, such as, for example at a periphery or outer region of the mask assembly 120. For example, FIG. 2B shows a mask assembly 120 having a region P corresponding to the substrate S, and an outer region P' of the mask assembly 120, not overlapping the substrate S. As shown, the outer region P' has the cooling path 124, and the region P does not have the cooling path 124. However, it is to be understood that both regions P, P' can have elements or portions of the cooling path 124 in other aspects.

In addition, when the gas supply unit 140 is disposed at a center portion of one side surface of the chamber 100 as shown in FIG. 1, since a larger amount of reaction gas is supplied to the center portion of the substrate than the periphery thereof, gaps w between the holes 122 of the mask assembly 120 may be gradually reduced from the center portion of the mask assembly 120 to the periphery so that the reaction gas supplied by the gas supply unit 140 can be uniformly deposited on the substrate S.

Figure 3A:
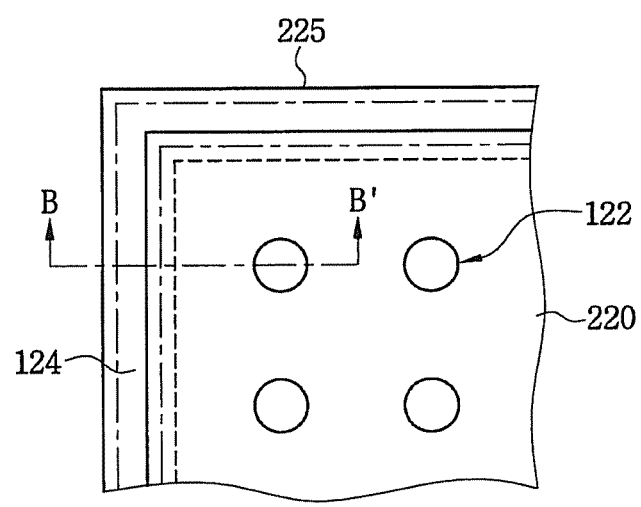
FIG. 3A is a plan view of a mask frame of the atomic layer deposition apparatus in accordance with another exemplary embodiment of the present invention.
Figure 3B:
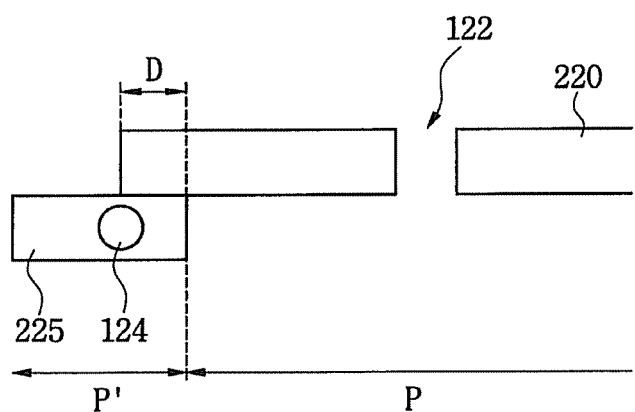
FIG. 3B is a cross-sectional view taken along line B-B' of FIG. 3A.

As shown in FIGS. 3A and 3B, the mask assembly 120 may be made up of a pattern mask 220 having a plurality of holes 122, and a mask frame 225 that supports the pattern mask 220. Since the entire pattern mask 220 except a region D coupled to the mask frame 225 is a region P corresponding to the substrate S, the cooling path 124 may be formed in the mask frame 225 in a region P' not overlapping the substrate S.

To avoid weakening the mask frame 225 due to presence of the cooling path 124, the cooling path 124 may be located such that the cooling path 124 partially or entirely overlap the region D where the mask frame 225 is coupled with the pattern mask 220.

The vacuum pump 130 controls a pressure in the chamber 100. In order to readily deposit an atomic layer, the inner pressure may be maintained at 0.2 Torr at the beginning of introduction of each reaction gas, and maintained at about 1 to 5 Torr during the ALD process. However, the pressure is not limited thereto.

The gas supply unit 140 sequentially supplies the reaction gases into the chamber 100 to form an atomic layer on the substrate S. Since the reaction gas supplied by the gas supply unit 140 should be uniformly injected into the chamber 100 to uniformly deposit the atomic layer on the substrate S, the gas supply unit 140 may include a gas supply line 142 that connects the chamber 100 to each storage source (not shown) in which a reaction gas (such as, for example, the first and second reaction gasses) is stored, and a shower head 144 installed at an end of the gas supply line 142 and having a plurality of injection ports 145, as shown in FIG. 1.

The coolant source 150 supplies coolant into the cooling path 124 of the mask assembly 120. The coolant may be cooling water or anti-freezing solution, or any other material that can readily discharge heat from the mask assembly 120.

Hereinafter, a method of fabricating an atomic layer using an atomic layer deposition apparatus in accordance with an exemplary embodiment of the present invention will be described. A substrate S is seated on a surface of a substrate holder 110 facing a gas supply unit 140. A mask assembly 120 is disposed to be spaced apart a first distance from the substrate S. The substrate S is heated using the heater 115 of a substrate holder 110. Coolant is supplied into a cooling path 124 of the mask assembly 120, and then, the mask assembly 120 is cooled. The atomic layer deposition apparatus in accordance with an exemplary embodiment of the present invention limits a moving path of a reaction gas supplied by the gas supply unit 140 using the mask assembly 120, maintains the interior of the chamber 100 in a vacuum state using the vacuum pump 130, and spaces the mask assembly 120 from the substrate S by a certain distance, so that the reaction gas that passes through holes 122 of the mask assembly 120 can be diffused to even a portion covered by the mask assembly 120 to be uniformly deposited on the substrate S. Therefore, when a gap w between the holes 122 of the mask assembly 120 is increased, a distance h between the mask assembly 120 and the substrate S may be increased so that the reaction gas passed through the holes 122 of the mask assembly 120 can be substantially diffused. That is, the distance h between the mask assembly 120 and the substrate S may be determined depending on the gap w between the holes 122 of the mask assembly 120.

A first reaction gas having a deposition material to be deposited on the substrate S through the gas supply unit 140 and a second reaction gas which chemically reacts with the first reaction gas to form an atomic layer of the deposition material on the substrate S are sequentially supplied into the chamber 100 to form the atomic layer of the deposition material on the substrate S. In order to prevent formation of impurities due to chemical reaction of the first and second reaction gases in the chamber and not on the surface of the substrate, an inert gas in the chamber may be substantially removed before supplying of the first and second reaction gases.

The atomic layer deposition apparatus in accordance with an exemplary embodiment of the present invention includes the heater installed in the substrate holder on which the substrate is seated and the mask assembly having a cooling unit installed therein and spaced apart a certain distance from the substrate. Therefore, it is possible to prevent deformation of the mask assembly due to heat applied to the substrate and generation of a chemical reaction of the reaction gas on the surface of the mask assembly or in the hole, so that the reaction gas can be uniformly deposited on the substrate.

As can be seen from the foregoing, an atomic layer deposition apparatus in accordance with an exemplary embodiment of the present invention includes a cooling path formed in a mask assembly and a heater installed in a substrate holder on which a substrate is seated. During an atomic layer deposition process, coolant is supplied through the cooling path of the mask assembly to cool the mask assembly, and the substrate is heated by the heater of the substrate holder. Therefore, it is possible to substantially heat the substrate to generate chemical reaction of a reaction gas and simultaneously prevent deformation of the mask holder due to the heat. In addition, since chemical reaction by a reaction gas at the surface of the mask assembly or in a hole can be prevented, it is possible to uniformly deposit a metal catalyst layer on the substrate at ultimately low concentration.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An atomic layer deposition apparatus comprising:
   a chamber;
   a vacuum pump configured to control a pressure in the chamber;
   a gas supply unit disposed opposite to the vacuum pump to supply a reaction gas into the chamber;
   a substrate holder disposed between the vacuum pump and the gas supply unit and comprising a heater;
   a mask assembly disposed between the substrate holder and the gas supply unit and comprising a cooling path to circulate coolant, the cooling path being formed in an edge of the mask assembly and configured such that the cooling path does not overlap a substrate held by the substrate holder; and a coolant source configured to supply the coolant into the cooling path of the mask assembly, wherein the mask assembly has a plurality of holes spaced apart from each other, and wherein gaps between a closest neighboring pair of circular holes increase as a function of a distance between the mask assembly and the substrate holder increases.

2. The apparatus according to claim 1, wherein the mask assembly comprises a pattern mask having the plurality of holes and a mask frame supporting the pattern mask; and the cooling path is formed in the mask frame.

3. The apparatus according to claim 2, further comprising a coupling region joining the pattern mask and the mask frame, and wherein the cooling path partially or entirely overlaps the coupling region of the pattern mask and the mask frame.

4. The apparatus according to claim 1, wherein the cooling path is formed in an outer region of the mask assembly not overlapping a substrate when the substrate is seated on the substrate holder.

5. The apparatus according to claim 1, wherein the vacuum pump and the gas supply unit are disposed at a side surface of the chamber, and the substrate holder is disposed parallel to the side surface of the chamber.

6. The apparatus according to claim 5, wherein the substrate holder has a surface facing the gas supply unit that is inclined by a certain angle with respect to a surface of the gas supply unit facing the vacuum pump.

7. The apparatus according to claim 6, wherein the certain angle comprises an angle between 1° and 20°.

8. The apparatus according to claim 1, wherein the mask assembly has the plurality of holes spaced apart from each other, and wherein gaps between the closest neighboring pair of circular holes decrease as a function of distance from a center portion of the mask assembly to an edge thereof.

9. The apparatus according to claim 1, wherein the coolant is cooling water or an anti-freezing solution.

10. The apparatus according to claim 1, further comprising an exhaust pump configured to remove an inert gas in the chamber.

11. The apparatus according to claim 1, wherein the gas supply unit has a shower head disposed at an end of the gas supply unit facing the substrate and having a plurality of injection ports.

12. An atomic layer deposition apparatus to deposit a layer on a substrate, comprising:

a deposition chamber;

a gas supply unit to supply a reaction gas into the deposition chamber;

a heated substrate holder to hold the substrate in a position in the deposition chamber such that the reaction gas is deposited on the substrate; and a mask assembly disposed between the substrate holder and the gas supply unit to diffuse the reaction gas before the reaction gas is deposited on the substrate, the mask assembly comprising a cooling path to circulate coolant, the cooling path being formed in an edge of the mask assembly and configured such that the cooling path does not overlap a substrate held by the substrate holder, wherein the mask assembly has a plurality of holes spaced apart from each other, and wherein gaps between a closest neighboring pair of circular holes increase as a function of a distance between the mask assembly and the substrate holder increases.

13. The atomic layer deposition apparatus of claim 12, wherein the mask assembly comprises a central portion corresponding in area and position with the substrate, and the cooling path is in a peripheral portion of the mask assembly surrounding the central portion.

* * * * *